(12) United States Patent
Wang et al.

(10) Patent No.: US 10,395,945 B2
(45) Date of Patent: Aug. 27, 2019

(54) BONDING DEVICE FOR CHIP ON FILM AND DISPLAY PANEL AND BONDING METHOD FOR THE SAME

(71) Applicant: BOE Technology Group Co., Ltd., Beijing (CN)

(72) Inventors: Lili Wang, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 15/647,882

(22) Filed: Jul. 12, 2017

(65) Prior Publication Data

US 2018/0053664 A1 Feb. 22, 2018

(30) Foreign Application Priority Data

Aug. 19, 2016 (CN) .......................... 2016 1 0689107

(51) Int. Cl.
*B23K 20/12* (2006.01)
*H01L 21/447* (2006.01)
(Continued)

(52) U.S. Cl.
CPC .......... *H01L 21/447* (2013.01); *B23K 20/121* (2013.01); *H01L 21/203* (2013.01);
(Continued)

(58) Field of Classification Search
CPC ... B23K 20/121; H01L 21/203; H01L 21/447; H01L 21/6838; H01L 21/76251;
(Continued)

(56) References Cited

U.S. PATENT DOCUMENTS

2006/0243391 A1* 11/2006 Onituka ................ H05K 13/00
156/358

FOREIGN PATENT DOCUMENTS

CN 202421665 U 9/2012
CN 104849887 A 8/2015
(Continued)

OTHER PUBLICATIONS

Search Report for Chinese Patent Application No. 201610689107.0, dated Feb. 16, 2017, 9 pages.
(Continued)

*Primary Examiner* — George R Koch
(74) *Attorney, Agent, or Firm* — Westman, Champlin & Koehler, P.A.

(57) ABSTRACT

The embodiments of the present disclosure provide a bonding device for a chip on film and a display panel and a bonding method for the same. The bonding device includes: a bearing stage having a horizontal bearing surface for supporting at least one row of display panels, wherein one row of the at least one row of display panels has a row of first bonding regions; a grasping unit disposed above the bearing stage and configured to grasp at least a partial area of the entire chip on film so that a row of second bonding regions of the entire chip on film is horizontally located above the one row of display panels; and a bonding unit configured to bond the row of second bonding regions which has been aligned with the row of first bonding regions to the row of first bonding regions.

19 Claims, 2 Drawing Sheets

(51) Int. Cl.
    *H01L 21/762*      (2006.01)
    *H01L 23/482*      (2006.01)
    *H01L 21/683*      (2006.01)
    *H01L 21/203*      (2006.01)
    *H01L 21/60*      (2006.01)

(52) U.S. Cl.
    CPC .... H01L 21/6838 (2013.01); H01L 21/76251 (2013.01); H01L 23/4828 (2013.01); *H01L 2021/60187* (2013.01); *H01L 2224/75* (2013.01)

(58) Field of Classification Search
    CPC ....... H01L 2021/60187; H01L 2224/75; H01L 23/4828
    See application file for complete search history.

(56) References Cited

FOREIGN PATENT DOCUMENTS

| | | |
|---|---|---|
| CN | 105044956 A | 11/2015 |
| CN | 105093586 A | 11/2015 |
| JP | 2000-275593 A | 10/2000 |

OTHER PUBLICATIONS

First Office Action, including Search Report, for Chinese Patent Application No. 201610689107.0, dated Apr. 25, 2017, 10 pages.
Second Office Action from Chinese Patent Application 201610689107.0, dated Aug. 10, 2017, 8 pages.

* cited by examiner

BONDING DEVICE FOR CHIP ON FILM AND DISPLAY PANEL AND BONDING METHOD FOR THE SAME

CROSS-REFERENCE TO RELATED APPLICATION

This application claims the benefit of Chinese Patent Application No. 201610689107.0, filed on Aug. 19, 2016 in the State Intellectual Property Office of China, entitled "BONDING DEVICE FOR CHIP ON FILM AND DISPLAY PANEL AND BONDING METHOD FOR THE SAME", the disclosure of which is incorporated in entirety herein by reference.

BACKGROUND

Technical Field

Embodiments of the present disclosure relate to a field of display technology, and more particularly, to a bonding device for a chip on film and a display panel and a method for bonding a chip on film and a display panel.

Description of the Related Art

With rapid development of electronic technology, more requirements for display devices, such as large size, narrow frame, and high resolution, are raised. A bonding technology with a chip on film (COF) (herein called as COF bonding) becomes an important way to achieve this goal. The COF bonding refers to use of a chip on film (for example, a flexible printed circuit film) having a bonding region at both ends thereof respectively, the bonding region at one end of the chip on film is bonded to a bonding region of a display panel by a method such as thermal bonding or the like, and the bonding region at the other end of the chip on film is bonded to a bonding region of a driving printed circuit board (PCB), thereby achieving an electrical connection between the driving PCB and the display panel.

As for the current display manufacturing techniques, a plurality of display panels are typically produced on a large-sized glass substrate (called a glass mother substrate), and then the entire glass mother substrate with the produced display panels is divided into a plurality of areas (for example, four areas, each area can be called a Q-Panel module), each area has a plurality of display panels arranged in an array, that is, multiply rows of display panels which are spaced apart from each other uniformly, and each row of display panels includes a plurality of individual display panels which are spaced apart from each other uniformly. Each display panel is formed with a bonding region to be bonded to the bonding region at one end of the chip on film.

In the prior art, all Q-Panel modules are bonded by an open cell bonding, in which all the display panels on the Q-panel module are cut into multiple independent display panels and then the individual display panels are respectively bonded to each separate strip of chip on film. Due to one-by-one bonding, such bonding manner of the chip on film and the display panel is time-consuming and energy-consuming, resulting in poor efficiency. In addition, it is necessary to previously cut the entire chip on film into several strips of the chip on film so as to match with a single display panel. For a display panel having a thickness of less than 1 mm, a thickness of the chip on film bonded thereto is smaller. For example, the current flexible display screen has a thickness of about 0.5 mm, and the thickness of the chip on film is about 0.1 mm). In such a case, the single display panel is likely to curl, the strip of the chip on film after cutting is more likely to curl because of poor adsorption, thereby adversely affecting alignment accuracy during the bonding due to the lack of flat adsorption.

SUMMARY

In view of the above drawbacks or deficiencies, the present disclosure proposes an improved solution for the bonding of the chip on film and the display panel that can at least partially address or eliminate the above problems.

In one aspect, there is provided 1. A bonding device for a chip on film and a display panel, comprising:

a bearing stage having a horizontal bearing surface for supporting at least one row of display panels, wherein one row of the at least one row of display panels has a row of first bonding regions;

a grasping unit disposed above the bearing stage and configured to grasp at least a partial area of the entire chip on film so that a row of second bonding regions of the entire chip on film is horizontally located above the one row of the display panels; and a bonding unit configured to bond the row of second bonding regions which has been aligned with the row of first bonding regions, to the row of first bonding regions.

In one example, the bonding device further comprising a driving unit configured to enable the grasping unit and the bearing stage to move with respect to each other so that the row of second bonding regions is aligned with the row of first bonding regions.

In one example, the bonding device further comprising a controller connected to the driving unit in a signal transmittable manner.

In one example, the bonding device further comprising a detection unit connected to the controller in a signal transmittable manner and configured to detect position information of the row of second bonding regions relative to the row of first bonding regions, wherein the detection unit is configured to send alignment stopping information to the controller and the controller is configured to control the driving unit to stop aligning according to the alignment stopping information, when the row of second bonding regions is aligned with the row of first bonding regions.

In one example, the grasping unit has a vacuum suction portion having a vacuum suction hole for adsorbing at least a partial area of the entire clip on film.

In one example, the grasping unit further comprises a first baffle arranged vertically or obliquely with respect to the horizontal bearing surface of the bearing stage and a second baffle arranged in parallel with the first baffle, and the first baffle is spaced apart from the second baffle by a predetermined distance such that the entire chip on film is at least partially disposed between the first baffle and the second baffle.

In one example, the vacuum suction portion is located at a bottom of the first baffle and extends horizontally in a direction away from the second baffle.

In one example, the vacuum suction portion is attached to or integrally formed with the first baffle.

In one example, the grasping unit further comprises a horizontal support portion for bearing a portion of the entire chip on film and/or a driving printed circuit board connected to the entire chip on film, the horizontal support portion extending horizontally from a top of the second baffle in a direction away from the first baffle.

In one example, a connection portion between the vacuum suction portion and the first baffle has a smooth transition surface facing towards the entire chip on film.

In one example, a connection portion between the horizontal support portion and the second baffle has a smooth transition surface facing towards the entire chip on film.

In one example, at least one of the first baffle and the second baffle is made of an antistatic material.

In one example, the detection unit comprises:

at least one image acquisition apparatus for acquiring a relative position image of the row of second bonding regions and the row of first bonding regions with respect to each other;

an image information processing unit configured to determine whether the row of second bonding regions and the row of first bonding regions are aligned with each other according to the relative position image obtained by the at least one image acquisition apparatus and configured to send the alignment stopping information to the controller when the row of second bonding regions is aligned with the row of first bonding regions.

In one example, the at least one image acquisition apparatus comprises a camera mounted on the first baffle of the grasping unit by a bracket.

In one example, the bonding unit comprises a pressing head having a pressing surface, and the pressing head is configured to move towards the row of second bonding regions and the row of first bonding regions which have been aligned with each other, and configured to thermally bond the row of second bonding regions and the row of first bonding regions together by means of the pressing surface.

In one example, the grasping unit is provided with a longitudinally extending guide rail, a laterally extending connecting rod is attached to the pressing head, and one end of the connecting rod away from the pressing head cooperates with the guide rail so that the connecting rod is longitudinally movable along the guide rail.

In one example, the bonding unit further comprises a fixing bracket mounted on the grasping unit and located above the pressing head and an elastic member for connected between the fixing bracket and the pressing head.

In one example, the bonding device further comprising a separation unit configured to separate the entire clip on film bonded to the row of display panels into a plurality of strips of chip on film so that each of the strips of chip on film corresponds to one display panel of the row of display panels.

In another aspect, it provides a method for bonding a chip on film and a display panel using the bonding device according to any of the above examples, comprising:

placing a substrate having the at least one row of display panels on the bearing stage, the first bonding regions of one row of the at least one row of display panels are arranged in a row;

grasping at least a partial area of the entire chip on film by the grasping unit so that the row of second bonding regions of the entire chip on film is horizontally located above the row of display panels;

moving the grasping unit and the bearing stage with respect to each other by a driving unit, and detecting the position information of the row of second bonding regions relative to the row of first bonding regions by the detection unit;

sending the alignment stopping information to a controller by the detection unit and controlling the driving unit to stop aligning according to the alignment stopping information by the controller, when the row of second bonding regions is aligned with the row of first bonding regions; and bonding the row of second bonding regions which has been aligned with the row of first bonding regions, to the row of first bonding regions by the bonding unit.

In one example, the method further comprising: taking out the row of display panels and the entire chip on film which have been bonded together; and separating the entire chip on film which has been taken out into a plurality of strips of chip on film so that each of the strips of chip on film corresponds to one display panel of the row of display panels.

BRIEF DESCRIPTION OF THE DRAWINGS

Below, embodiments of the present disclosure will be described in detail with reference to the accompanying drawings, in which.

DETAILED DESCRIPTION OF PREFERRED EMBODIMENTS

Figure 1:
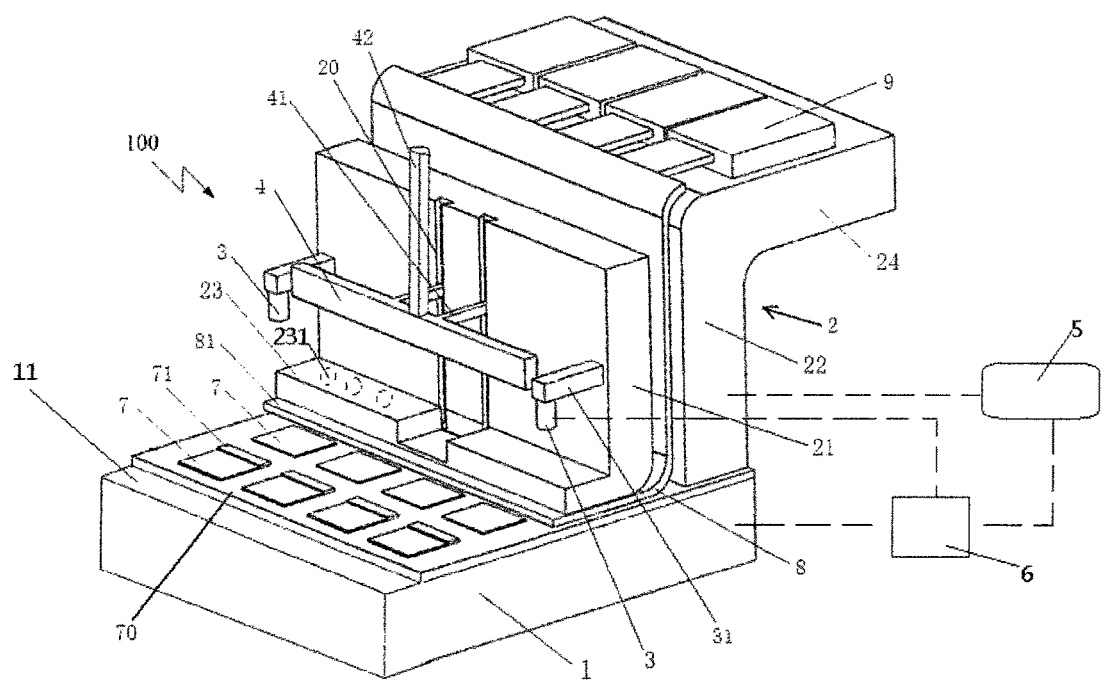
FIG. 1 shows a bonding device for a chip on film and a display panel according to an embodiment of the present disclosure.

In order to provide a better understanding of the solutions of the present disclosure for the person skilled in the art, bonding devices and bonding methods for a chip on film and a display panel according to embodiments of the present disclosure will now be described in detail with reference to the accompanying drawings and specific embodiments of the present disclosure. Obviously, the described embodiments are only a part of all the embodiments of the present disclosure, rather than all of the embodiments. Any other embodiments obtained by the person skilled in the art based on the described embodiments of the present disclosure without creative efforts fall within the scope of the present disclosure.

Now referring to FIG. 1, it shows a part of structure of a bonding device 100 for a chip on film and a display panel (hereinafter abbreviatedly referred to as the bonding device) according to an embodiment of the present disclosure. The bonding device 100 at least includes: a bearing stage 1, a grasping unit 2, a driving unit 5, a controller 6, detection units 3, 31, 32 and a bonding unit 4.

The bearing stage 1 is generally horizontally arranged and has a horizontal bearing surface 11 for supporting at least one row of display panels 7. At present, a plurality of display panels 7 are simultaneously manufactured on a glass mother substrate, and then the glass mother substrate is divided into Q-Panel modules for transport. A plurality of display panels 7 on each Q-Panel module are arranged in an array. It will be understood that the bearing stage 1 may support the at least one row of display panels 7 by means of a substrate (typically a glass substrate) 70 to support a Q-Panel module on which the at least one row of display panels 7 is located. In this embodiment, the substrate 70 supported on the bearing stage 1 has two rows of display panels, each having four separate display panels 7, and a first bonding region 71 is prepared on each of the display panels 7 in advance, and the first bonding regions 71 on each row of display panels 7 are also arranged in a row. Of course, in other embodiments, the display panels 7 supported on the substrate 70 of the Q-Panel module may be arranged in one row or more than two rows, and the number of display panels of each row of display panels 7 is not limited to four.

The grasping unit 2 is placed above the bearing stage 1, and the grasping unit 2 is configured to grasp at least a partial area of the entire chip on film 8. In this embodiment, the grasping unit 2 has a vacuum suction portion 23 having a vacuum suction hole 231, which may be communicated with a vacuum pumping device for adsorbing the at least a partial area of the entire chip on film 8 so as to grasp the entire flip chip film 8. The entire chip on film 8 has bonding regions to be bonded to the display panels 7 at one end, and at the other end, the entire chip on film 8 has bonding regions to be bonded to a driving printed circuit board (PCB). In this embodiment, the bonding regions of the entire chip on film 8 to be bonded to the display panels 7 are defined as second bonding regions 81. It will be understood that the entire chip on film 8 mentioned in this embodiment may be a chip on film which is prepared in advance and corresponds to a row of display panels 7 to be attached, and the second bonding regions of the entire chip on film 8 are also arranged in a row. The vacuum suction portion 23 at least allows a row of second bonding regions 81 of the entire chip on film 8 to be horizontally located above the display panels 7 by vacuum adsorption, and the row of second bonding regions 81 protrudes out from the vacuum suction portion 23 so as to facilitate subsequent bonding processes.

The grasping unit 2 may be implemented in various modes as long as the entire chip on film 8 may be kept flat and it is not easy to curl and the region where the second bonding regions 81 is located may be located above the row of display panels 7, and the grasp of the entire chip on film 8 can be easily released when the bonding is completed.

One kind of a structure of the grasping unit 2 is also shown in this embodiment. As shown in FIG. 1, the grasping unit 2 further includes a first baffle 21 and a second baffle 22. The first baffle 21 is arranged vertically or obliquely with respect to the horizontal bearing surface 11 of the bearing stage 1. The second baffle 22 is arranged in parallel with the first baffle 21, and the first baffle 21 is spaced apart from the second baffle 22 by a predetermined distance such that an non-bonding region of the entire chip on film 8 are at least partially disposed between the first baffle 21 and the second baffle 22. By providing the first baffle 21 and the second baffle 22, on one hand, it ensures that the entire chip on film 8 may be kept flat in a simple and effective manner and thereby the curling may be avoided during the alignment process; on the other hand, the entire chip on film 8 occupies a reduced space above the substrate 70 by erecting the entire chip on film 8, thereby facilitating adsorption, alignment and bonding operation of the entire chip on film 8 and thus being beneficial to improve alignment accuracy.

In order to make the structure of the grasping unit 2 more compact, in one example, the vacuum suction portion 23 is located at a bottom of the first baffle 21 and the vacuum suction portion 23 extends horizontally in a direction away from the second baffle 22. The vacuum suction portion 23 and the first baffle 21 may be attached together by bonding, welding, screwing or the like, or the vacuum suction portion 23 may be integrally formed with the first baffle 21. In an example, a connection portion between the vacuum suction portion 23 and the first baffle 21 can have a smooth transition surface facing towards the entire chip on film 8, so as to avoid damage to a circuit within the entire chip on film 8. In an example, the vacuum suction portion 23 is perpendicular to the first baffle 21 so as to facilitate the manufacturing.

In addition, it can be seen from FIG. 1 that one end of the entire chip on film 8 away from the row of display panels 7 has been bonded to a corresponding row of printed circuit boards (PCB) 9, the number of the PCBs in the row of driving PCBs is equal to the number of the display panels in the row of display panels 7. That is to say, the entire chip on film 8 has been bonded to the respective driving printed circuit boards 9 before the entire chip on film 8 is placed on the bonding device 100 to be aligned and bonded. Since such a bonding does not involve in the display panels 7, the operation is relatively simple and can be done at other locations outside the bonding device 100 using appropriate methods and tools known in the art. In this case, the structure of the second baffle 22 is optimized in this embodiment, a horizontal support portion 24 is provided at a top of the second baffle 22, and the horizontal support portion 24 is used to bear a portion of the entire chip on film 8 and/or the driving printed circuit boards 9 connected to the entire chip on film 8, and the horizontal support portion 24 extends horizontally from the top of the second baffle 22 in a direction away from the first baffle 21. By providing the horizontal support portion 24, it facilitates proper placement of the entire chip on film 8 during alignment and bonding.

It will be understood that, even if the entire chip on film 8 is not bonded to the printed circuit boards 9 before it is boned to the row of display panels 7 to be attached, it also facilitates reducing the probability that the entire chip on film 8 slides down between the first baffle 21 and the second baffle 22, because the horizontal support portion 24 is provided so that the entire chip on film 8 hangs over an upper surface of the horizontal support portion 24. In an example, the horizontal support portion 24 is perpendicular to the second baffle 22, and a connection portion between the horizontal support portion 24 and the second baffle 22 has a smooth transition surface facing towards the entire chip on film 8, so as to avoid damage to the circuit within the entire chip on film 8.

In an example, at least one of the first baffle 21 and the second baffle 22 is made of an antistatic material, for example metal. By means of the first baffle 21 and the second baffle 22 made of an antistatic material, it is possible to effectively release static electricity generated during the operation, so as to prevent damage to the circuit of a liquid crystal cell and the chip on film. In addition, it should be noted that heights and scales of the first baffle 21 and the second baffle 22 shown in FIG. 1 are not limited to that heights or scales in the drawing. They can be determined and adjusted according to a length of the entire clip on film 8 and the actual operation needs.

The driving unit 5 is configured to enable the grasping unit 2 and the bearing stage 1 to move relative to each other so that the row of second bonding regions 81 of the entire clip on film 8 is aligned with the row of first bonding regions 71 of the row of display panels to be attached. The driving unit 5 (for example, including a motor and a transmission mechanism) for achieving the relative movement of the grasping unit 2 and the bearing stage 1 may be implemented in various modes, for example, in an embodiment, one of the grasping unit 2 and the bearing stage 1 may be kept fixed and the other may be moved in a front-rear direction, a left-right direction, and/or a up-down direction, under the drive of the driving unit; or alternatively, in another embodiment, the driving unit can both drive the grasping unit 2 and the bearing stage 1 so that both the grasping unit 2 and the bearing stage 1 can move. It should be noted that, in the embodiment of the present disclosure, the "left-right direction" refers to an extension direction of any row of display panels 7 located on the horizontal bearing surface 11 of the bearing stage 1, and the "front-rear direction" refers to a direction in parallel to the above horizontal bearing surface 11 and perpendicular to the extension direction of the above row of display panels 7, and the "up-down direction" is meant to a height direction.

In an embodiment, the grasping unit 2 may be fixedly supported above the bearing stage 1 by a support mechanism (for example, a fixing bracket, not shown), the bearing stage 1 is supported by a base (not shown), and a slide rail which is slidably engaged with the bearing stage 1 can be provided on the base. The driving unit 5 is connected to the bearing stage 1 to drive the bearing stage 1 to move for example in the front-rear direction or the left-right direction along the slide rails, so that the row of second bonding regions 81 and the row of first bonding regions 71 to be attached may be bonded to each other after they are aligned with each other. After the bonding is completed, the entire chip on film 8 and the row of display panels 7 which have been bonded together may be moved out of the operation space by the movement of the bearing stage 1 and taken out, and then a next row of display panels 7 and another chip on film 8 may be implemented to be bonded. In an example, rollers may further be mounted between the bearing stage 1 and the slide rails, which may facilitate reducing movement resistance of the bearing stage 1 and improving movement stability of the bearing stage 1.

The controller 6 is connected to the driving unit 5 and the detection units 3, 31, 32 in a signal transmittable manner. The detection unit is configured to detect position information of the row of second bonding regions 81 relative to the row of first bonding regions 71 to be attached. When the row of second bonding regions 81 is aligned with the row of first bonding regions 71, the detection unit sends alignment stopping information to the controller 6 and the controller 6 controls the driving unit 5 to stop aligning according to the alignment stopping information, the driving unit 5 then stops driving the grasping unit 2 and/or the bearing stage 1 so that the relative movement between the grasping unit 2 and the bearing stage 1 is stopped. By providing the controller 6 and the detection unit, it is possible to automatically control the alignment process of the row of second bonding regions 81 and the row of first bonding regions 71 to be attached. As a result, it not only improves alignment efficiency, but also ensures alignment precision.

It will be understood that the detection unit may be implemented in various modes, and one embodiment of the detection unit is presented in this embodiment. In particular, the detection unit may include an image information processing unit 32 and at least one image acquisition apparatus 3. The image acquisition apparatus 3 is used for acquiring a relative position image of the row of second bonding regions 81 and the row of first bonding regions 71 to be attached with respect to each other and sending the relative position image to the image information processing unit 22 for processing. The image information processing unit 32 may be implemented by a computing device having processing capability, such as a computer, a workstation, a server, a tablet computer, a smart terminal device and the like. The image information processing unit 32 is configured to determine whether the row of second bonding regions 81 and the row of first bonding regions 71 to be attached are aligned with each other or not, according to the relative position image obtained by the image acquisition apparatus 3. The image information processing unit 32 can generate a corresponding driving command according to the above determination and send the driving command to the driving unit to implement a proper movement, and when the row of second bonding regions 81 is aligned with the row of first bonding regions 71 to be affixed, the image information processing unit 32 sends the alignment stopping information to the controller 6.

The image acquisition apparatus 3 is for example a camera mounted on the grasping unit 2 by a bracket 31. Specifically, in this embodiment, since the grasping unit 2 includes the first baffle 21, the camera may be mounted on the first baffle 21 by the bracket 31 and on the same side of the first baffle 21 as the vacuum suction portion 23. The bracket 31 has a suitable length so that a lens of the camera 3 rightly faces towards the direction where the row of second bonding regions 81 of the entire chip on film 8 is located. In this way, it is easier to obtain the relative position image of the row of second bonding regions 81 and the row of first bonding regions 71 to be attached with respect to each other, thereby facilitating to determine whether they are aligned with each other or not.

In an example, two cameras are provided for acquiring images of two ends of the row of second bonding regions 81 and the row of first bonding regions 71 to be attached during the alignment process, so as to ensure that the row of second bonding regions 81 and the row of first bonding regions 71 are aligned with each other. Of course, in other embodiments, more than two cameras may be used, for example, in a case that the row of display panels 7 has a relatively large length. Of course, if a field of view of the camera is wide enough, it is feasible to use only one camera. In addition, although at the present embodiment the camera is mounted on the first baffle 21 so as to achieve a relatively compact structure of the device, the camera may not be mounted on the first baffle 21 in other embodiments.

The bonding unit 4 is configured to bond together the row of second bonding regions 81 and the row of first bonding regions 71 to be affixed or attached which have been aligned with each other. The bonding unit 4 may be implemented in various modes as long as the row of second bonding regions 81 can be bonded to the row of first bonding regions 71 to be affixed. In this embodiment, a feasible structure of the bonding unit is shown.

In particular, the bonding unit 4 includes a pressing head 4 having a pressing surface, and the pressing head 4 is configured to move towards the row of second bonding regions 81 and the row of first bonding regions 71 which have been aligned with each other, and configured to thermally bond the row of second bonding regions 81 and the row of first bonding regions 71 together by means of the pressing surface, thereby achieving the bonding of the row of display panels 7 and the entire chip on film 8. In this embodiment, as shown in FIG. 1, the pressing head 4 is of a rod structure having a rectangular cross section and has a bottom side facing towards an alignment area of the chip on film 8 and the display panels 7, and the bottom side is used as the pressing surface. A width of the pressing surface of the pressing head 4 may be greater than or equal to a width of the second bonding regions 81 of the chip on film 8. In addition, the shape of the pressing head 4 is not limited to that shape in this embodiment, for example, the cross section thereof may be triangular, polygonal, or a part of the pressing head may be formed by a curved surface.

In this embodiment, the first baffle 21 of the grasping unit 2 is provided with longitudinally extending guide rails 20, laterally extending connecting rods 41 are attached to the pressing head 4, and one end of the connecting rod 41 away from the pressing head 4 cooperates with the guide rail 20 so that the connecting rod 41 is longitudinally movable along the guide rail 20. The connecting rod 41 may be connected to the pressing head 4 in any suitable manner known in the art, for example, they may be an integral connection, a fixed connection, a movable connection or the like. It will be understood that the connecting rod 41 has a suitable length so that the pressing surface of the pressing head 4 can press onto the row of second bonding regions 81 and the row of first bonding regions 71 to be affixed which have been aligned with each other when the pressing head 4 is moved from top to bottom by the drive of the connecting rod 41. In view of the known technique, it may be known that heating resistor wires may be provided in the pressing head 4 for achieving the thermal bonding of the chip on film and the display panels. In addition, although a longitudinal movement of the pressing head 4 is achieved by the cooperation of the connecting rod 41 and the guide rail 20 in this embodiment, it will be understood that there are many other ways to drive the pressing head 4 to move longitudinally in other embodiments, which will not be repeatedly discussed herein.

It can also be seen from FIG. 1 that an operating handle 42 extending upwardly in a longitudinal direction is provided on the middle of the pressing head 4 at a side of the pressing head 4 away from the pressing surface, and a thermal insulating sleeve is provided on the operating handle 42. By providing the operating handle 42, an operator can manually operate the pressing head 4 to longitudinally move the connecting rod 41 downwardly or upwardly along the guide rail 20. In an example, the connecting rod 41 and the guide rail 20 may be tightly engaged so that the connecting rod 41 may stay at any position on the guide rail 20 with the pressing head 4 when no external force is applied to the operating handle 42. When an external force is applied to the operating handle 42 so that the pressing head 4 is moved downwardly, the thermal bonding action of the pressing head 4 can be damped under the effect of the frictional force generated by the tight fitting.

Of course, in another embodiment, the longitudinal movement of the connecting rod 41 together with the pressing head 4 along the guide rail 20 may be driven by a driving mechanism, which may include for example a motor and a transmission mechanism. When the motor rotates, the connecting rod 41 can be driven by the transmission mechanism to drive the pressing head 4 to press downwardly, and then the entire chip on film 8 and the row of display panels 7 to be affixed are bonded together by thermal bonding, and then the pressing head 4 is driven to lift up. Of course, the driving mechanism may be a hydraulic driving mechanism or an air pressure driving mechanism.

It should be noted that, although the pressing head 4 is moved only in the up-down direction along the guide rail 20 in this embodiment, the movement modes of the pressing head 4 are not limited thereto. The pressing head 4 may also be configured to move along a curved line, approach and press the bonding regions. In addition, the pressing surface of the pressing head 4 does not need to be a flat surface, for example, it can be designed as a curved surface. In this way, the pressing for the bonding regions is achieved by rotation of the pressing head 4 about its own axis during the thermal bonding.

In an example, the bonding device also includes a separation unit 30 configured to separate the entire clip on film 8 bonded to the row of display panels 7 into a plurality of strips of chip on film so that each strip of the chip on film corresponds to one display panel 7 of the row of display panels 7.

Specifically, the row of display panels 7, the entire chip on film 8 and the row of driving printed circuit boards 9 which are bonded together may be taken out from the bonding position by moving the bearing stage 1, after the chip on film 8 has been bonded to the row of display panels 7. Then, they are separated into a plurality of individual display panels 7 by the separation unit, each one of which is connected to a driving printed circuit board 9 via the strip of chip on film which has been cut well. Then, a new chip on film 8 (which has been bonded to a new row of driving printed circuit board 9) may be loaded in the bonding device 100, and first bonding regions 71 of a next row of display panels 7 to be affixed on the substrate 70 may be moved to a position where they are aligned with a row of second bonding regions 81 of the new chip on film 8 by moving the bearing stage 1, and then a new thermal bonding action is carried out by the pressing head 4 so that they are bonded together and separated by the separation unit. As will be appreciated by the person skilled in the art, the separation unit may be implemented by a cutting tool suitable for cutting the chip on film 8.

Figure 2:
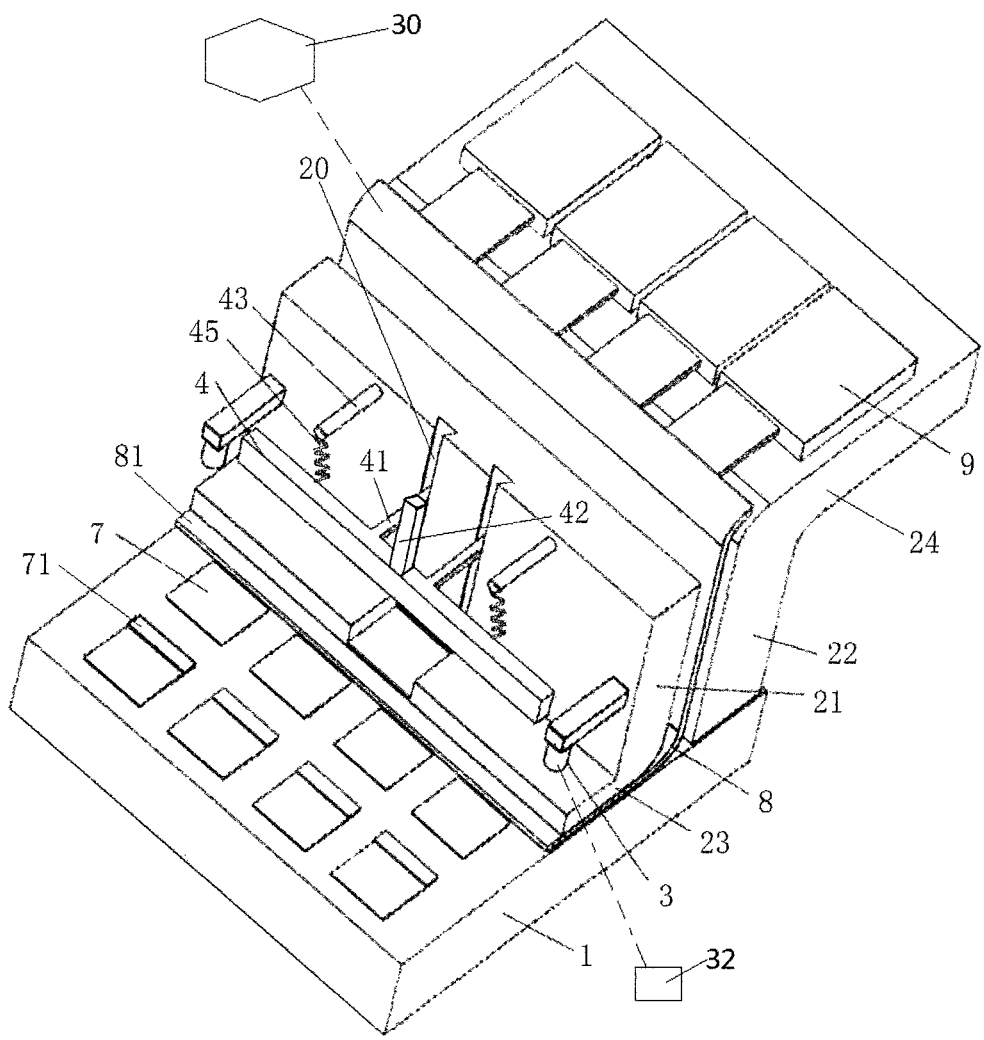
FIG. 2 shows another bonding device for a chip on film and a display panel according to an embodiment of the present disclosure.

Next, referring to FIG. 2, it shows a structure of another bonding device 100 according to an embodiment of the present disclosure. In this embodiment, the similar components to those of the embodiment shown in FIG. 1 are denoted by the same reference numerals, and for the purpose of simplicity, the corresponding description for them has been omitted herein. As can be seen in FIG. 2, the bonding unit in the bonding device 100 according to this embodiment further includes: a fixing bracket 43 mounted on the grasping unit 2 and located above the pressing head 4; and an elastic member 45 connected between the fixing bracket 43 and the pressing head 4. In an example, the elastic member 45 is a spring. In order to facilitate mounting the fixing bracket 43, the fixing bracket 43 may be provided on the first baffle 21 by a suitable fixing means. By providing this suspension mechanism (i.e., the fixing bracket 43 and the pressing head 4), the pressing head 4 will not suddenly or excessively strongly press against the aligned chip on film 8 and display panels 7 due to the control from the elastic connection when the pressing head 4 is moved downwardly. In addition, by providing this suspension mechanism, a tight fitting between the connecting rod 41 and the guide rail 20 may not be employed, and the pressing head 4 may be suspended at a suitable height by the elastic member 45.

As can be seen from FIG. 2, two sets of suspension mechanisms are employed in this embodiment, and located at both sides of a midpoint of the pressing head 4, respectively. In this way, it is possible to avoid inclination of the pressing head 4 due to unbalance of the elastic connection. Of course, more sets of suspension mechanisms may be used in other embodiments; or alternatively, for example, only one set of suspension mechanism may be used if the guide rail 20 can provide sufficient guidance and balance.

It can be seen from the above description that, the bonding device 100 according to embodiments of the present disclosure enables simultaneous alignment and bonding of the entire chip on film and the entire row of display panels, it overcomes the drawbacks in the prior art that the bonding manner for a single display panel and a single chip on film is time-consuming and energy-consuming during the bonding process and it is difficult to achieve flat adsorption and precise alignment, thereby improving alignment precision and efficiency for bonding the chip on film with the display panel.

The present disclosure also provides a bonding method for a chip on film 8 and a display panel 7 using the bonding device 100 according to the above embodiments. At least a part of steps of the method correspond to the operation of the various components of the bonding device 100 according to the embodiments of the present disclosure described above. For the purpose of brevity, partial details identical to the above description are omitted herein, therefore more details of the method can be obtained with reference to the above description.

The embodiment of the present disclosure also proposes a bonding method for a chip on film and a display panel. As shown in the figures, the bonding method for the chip on film and the display panel includes:

In a placement step: placing a substrate 70 having the at least one row of display panels 7 on the bearing stage 1, the first bonding regions 71 of one row of the at least one row of display panels 7 are arranged in a row; grasping at least a partial area of the entire chip on film 8 by the grasping unit 2 so that the row of second bonding regions 81 of the entire chip on film 8 is horizontally located above the one row of display panels 7. In an example, the grasping unit 2 includes a vacuum suction portion 23 which grasps the entire chip on film 8 by a vacuum adsorption effect. In addition, a row of driving printed circuit boards 9 may be previously bonded to the entire chip on film 8 before the entire chip on film 8 is adsorbed on the vacuum suction portion 23.

In an alignment step: making the grasping unit 2 and the bearing stage 1 to move with respect to each other by a driving unit, and detecting the position information of the row of second bonding regions 81 relative to the row of first bonding regions 71 to be affixed by the detection unit; sending the alignment stopping information to a controller 6 by the detection unit and controlling the driving unit to stop aligning according to the alignment stopping information by the controller 6, when the row of second bonding regions 81 is aligned with the row of first bonding regions 71 to be affixed.

In a bonding step: bonding the row of second bonding regions 81 which has been aligned with the row of first bonding regions 71, to the row of first bonding regions 71 to be affixed by the bonding unit.

According to an exemplary embodiment of the present disclosure, the method optionally further includes:

In an separation step: taking out the row of display panels 7 and the entire chip on film 8 which have been bonded together; and separating the entire chip on film 8 which has been taken out into a plurality of strips of chip on film so that each one of the strips of chip on film corresponds to one display panel of the row of display panels 7, i.e., in one-to-one corresponding relationship.

Then, the placement step, the alignment step, the bonding step, and the separation step may be repeatedly preformed for a new entire chip on film 8 and a next row of display panels 7 on the substrate 70.

A bonding method of a chip on film and a display panel according to an embodiment of the present disclosure has been described above with reference to the accompanying drawings, and it should be noted that the above description is merely exemplary and is not intended to limit the present disclosure. In other embodiments of the present disclosure, the method may have more, fewer or different steps, and the order of steps, the inclusion relation between the steps, and the function of the steps may be different from what has been described and illustrated. For example, a plurality of steps may generally be considered as a larger step, and a plurality of sub-steps included in one step may also be considered as a plurality of individual steps, and some of the steps described above may also be considered to be not in the bonding method of the display panel. Further for example, the order of the respective steps in the above description and illustrations generally does not form a limitation on the method of the present disclosure, and the steps may be performed in any order known to the person skilled in the art or simultaneously. Also, for example, the features included in the above exemplary embodiments may generally be combined with each other in any manner known to the person skilled in the art to form a new embodiment.

It will be understood that the above embodiments of the present disclosure are merely exemplary embodiments for explaining the principles of the present disclosure, but the present disclosure is not limited thereto. It will be apparent to the person skilled in the art that various changes and modifications can be made to the present disclosure without departing from the spirit and scope of the present disclosure, such changes and modifications also shall fall within the scope of the present disclosure. The scope of the present disclosure is defined only by the meaning of the language expression of the appended claims and their equivalents.

What is claimed is:

1. A bonding device for a chip on film and a display panel, comprising:
    a bearing stage having a horizontal bearing surface for supporting at least one row of display panels, wherein one row of the at least one row of display panels has a row of first bonding regions;
    a grasping unit disposed above the bearing stage and configured to grasp at least a partial area of the entire chip on film so that a row of second bonding regions of the entire chip on film is horizontally located above the one row of the display panels;
    a driving unit configured to enable the grasping unit and the bearing stage to move with respect to each other such that the entire chip on film grasped by the grasping unit is horizontally moved with respect to the at least one row of display panels supported on the horizontal bearing surface of the bearing stage, so that the row of second bonding regions of the entire chip on film are aligned with the row of first bonding regions, respectively; and
    a bonding unit configured to bond the row of second bonding regions which have been aligned with the row of first bonding regions respectively, to the row of first bonding regions.

2. The bonding device according to claim 1, further comprising a controller connected to the driving unit in a signal transmittable manner.

3. The bonding device according to claim 2, further comprising a detection unit connected to the controller in a signal transmittable manner and configured to detect position information of the row of second bonding regions relative to the row of first bonding regions, wherein the detection unit is configured to send alignment stopping information to the controller and the controller is configured to control the driving unit to stop aligning according to the alignment stopping information, when the row of second bonding regions are aligned with the row of first bonding regions, respectively.

4. The bonding device according to claim 1, wherein the grasping unit has a vacuum suction portion having a vacuum suction hole for adsorbing at least a partial area of the entire clip on film.

5. The bonding device according to claim 1, wherein the bonding unit comprises a pressing head having a pressing surface, and the pressing head is configured to move towards the row of second bonding regions and the row of first bonding regions which have been aligned with each other, and configured to thermally bond the row of second bonding regions and the row of first bonding regions together by means of the pressing surface.

6. The bonding device according to claim 5, wherein the grasping unit is provided with a longitudinally extending guide rail, a laterally extending connecting rod is attached to the pressing head, and one end of the connecting rod away from the pressing head cooperates with the guide rail so that the connecting rod is longitudinally movable along the guide rail.

7. The bonding device according to claim 5, wherein the bonding unit further comprises a fixing bracket mounted on the grasping unit and located above the pressing head and an elastic member connected between the fixing bracket and the pressing head.

8. The bonding device according to claim 1, further comprising a separation unit configured to separate the entire clip on film bonded to the row of display panels into a plurality of strips of chip on film so that each of the strips of chip on film corresponds to one display panel of the row of display panels.

9. A bonding device for a chip on film and a display panel, comprising:
   a bearing stage having a horizontal bearing surface for supporting at least one row of display panels, wherein one row of the at least one row of display panels has a row of first bonding regions;
   a grasping unit disposed above the bearing stage and configured to grasp at least a partial area of the entire chip on film so that a row of second bonding regions of the entire chip on film is horizontally located above the one row of the display panels; and
   a bonding unit configured to bond the row of second bonding regions which have been aligned with the row of first bonding regions respectively, to the row of first bonding regions,
   wherein the grasping unit has a vacuum suction portion having a vacuum suction hole for adsorbing at least a partial area of the entire clip on film, and
   wherein the grasping unit further comprises a first baffle arranged vertically or obliquely with respect to the horizontal bearing surface of the bearing stage and a second baffle arranged in parallel with the first baffle, and the first baffle is spaced apart from the second baffle by a predetermined distance such that the entire chip on film is at least partially disposed between the first baffle and the second baffle.

10. The bonding device according to claim 9, wherein the vacuum suction portion is located at a bottom of the first baffle and extends horizontally in a direction away from the second baffle.

11. The bonding device according to claim 10, wherein the vacuum suction portion is attached to or integrally formed with the first baffle.

12. The bonding device according to claim 10, wherein the grasping unit further comprises a horizontal support portion for bearing a portion of the entire chip on film and/or a driving printed circuit board connected to the entire chip on film, the horizontal support portion extending horizontally from a top of the second baffle in a direction away from the first baffle.

13. The bonding device according to claim 12, wherein a connection portion between the horizontal support portion and the second baffle has a smooth transition surface facing towards the entire chip on film.

14. The bonding device according to claim 9, wherein a connection portion between the vacuum suction portion and the first baffle has a smooth transition surface facing towards the entire chip on film.

15. The bonding device according to claim 9, wherein at least one of the first baffle and the second baffle is made of an antistatic material.

16. The bonding device according to claim 9, wherein the detection unit comprises:
   at least one image acquisition apparatus for acquiring a relative position image of the row of second bonding regions and the row of first bonding regions with respect to each other;
   an image information processing unit configured to determine whether the row of second bonding regions and the row of first bonding regions are aligned with each other according to the relative position image obtained by the at least one image acquisition apparatus and configured to send the alignment stopping information to the controller when the row of second bonding regions are aligned with the row of first bonding regions, respectively.

17. The bonding device according to claim 16, wherein the at least one image acquisition apparatus comprises a camera mounted on the first baffle of the grasping unit by a bracket.

18. A method for bonding a chip on film and a display panel using the bonding device according to claim 1, comprising:
   placing a substrate having the at least one row of display panels on the bearing stage, the first bonding regions of one row of the at least one row of display panels are arranged in a row;
   grasping at least a partial area of the entire chip on film by the grasping unit so that the row of second bonding regions of the entire chip on film is horizontally located above the row of display panels;
   moving the grasping unit and the bearing stage with respect to each other by a driving unit, and detecting the position information of the row of second bonding regions relative to the row of first bonding regions by the detection unit such that the entire chip on film grasped by the grasping unit is horizontally moved with respect to the at least one row of display panels supported on the horizontal bearing surface of the bearing stage, so that the row of second bonding regions of the entire chip on film are aligned with the row of first bonding regions, respectively;
   sending the alignment stopping information to a controller by the detection unit and controlling the driving unit to stop aligning according to the alignment stopping information by the controller, when the row of second bonding regions are aligned with the row of first bonding regions, respectively; and
   bonding the row of second bonding regions which have been aligned with the row of first bonding regions respectively, to the row of first bonding regions by the bonding unit.

19. The method according to claim 18, further comprising: taking out the row of display panels and the entire chip on film which have been bonded together; and separating the entire chip on film which has been taken out into a plurality of strips of chip on film so that each of the strips of chip on film corresponds to one display panel of the row of display panels.

* * * * *